(12) United States Patent
Jang et al.

(10) Patent No.: US 12,230,746 B2
(45) Date of Patent: Feb. 18, 2025

(54) DISPLAY APPARATUS

(71) Applicant: SAMSUNG ELECTRONICS CO., LTD., Suwon-si (KR)

(72) Inventors: Hyukjun Jang, Suwon-si (KR); Sungyeol Kim, Suwon-si (KR); Jaewoo Kim, Suwon-si (KR); Taeyeon Kim, Suwon-si (KR); Junsung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/195,534

(22) Filed: May 10, 2023

(65) Prior Publication Data
US 2023/0420620 A1    Dec. 28, 2023

Related U.S. Application Data

(63) Continuation of application No. PCT/KR2023/005262, filed on Apr. 19, 2023.

(30) Foreign Application Priority Data

Jun. 24, 2022 (KR) .................. 10-2022-0077848
Aug. 24, 2022 (KR) .................. 10-2022-0106277

(51) Int. Cl.
*H01L 33/58* (2010.01)
*G02F 1/1335* (2006.01)
(Continued)

(52) U.S. Cl.
CPC ........ *H01L 33/58* (2013.01); *G02F 1/133603* (2013.01); *G02F 1/133605* (2013.01);
(Continued)

(58) Field of Classification Search
CPC ... H01L 33/58; H01L 25/13; G02F 1/133607; G02F 1/133603; G02F 1/133605; G02F 1/133608; G02F 1/133621
See application file for complete search history.

(56) References Cited

U.S. PATENT DOCUMENTS 7,661,844 B2    2/2010   Sekiguchi et al.
7,859,614 B2 *  12/2010  Moon ................ H01L 33/58
                                                     349/69
(Continued)

FOREIGN PATENT DOCUMENTS

JP    4724618 B2    7/2011
JP    5302738 B2    10/2013
(Continued)

OTHER PUBLICATIONS

International Search Report (PCT/ISA/210) issued on Aug. 30, 2023 by the International Searching Authority in International Patent Application No. PCT/KR2023/005262.
(Continued)

*Primary Examiner* — Nathanael R Briggs
(74) *Attorney, Agent, or Firm* — Sughrue Mion, PLLC

(57) ABSTRACT

Disclosed herein is a display apparatus. The display apparatus includes: a liquid crystal panel; and a backlight unit configured to emit light to the liquid crystal panel. The backlight unit includes: a substrate extending along a first direction; a light emitting diode provided on the substrate; a refractive cover provided on the light emitting diode to refract light emitted from the light emitting diode; and a lens provided on the substrate and the refractive cover, the lens comprising a bottom surface having a first length in the first direction that is less than a second length in a second direction perpendicular to the first direction.

17 Claims, 13 Drawing Sheets

(51) Int. Cl.
*G02F 1/13357* (2006.01)
*H01L 25/13* (2006.01)

(52) U.S. Cl.
CPC .. *G02F 1/133607* (2021.01); *G02F 1/133608* (2013.01); *G02F 1/133621* (2013.01); *H01L 25/13* (2013.01)

(56) References Cited

U.S. PATENT DOCUMENTS

| | | | |
|---|---|---|---|
| 8,444,296 | B2 | 5/2013 | Park et al. |
| 9,693,581 | B2 | 7/2017 | Sasako et al. |
| 10,900,636 | B2 | 1/2021 | Mochida |
| 11,204,150 | B1 | 12/2021 | Han |
| 11,428,985 | B2 | 8/2022 | Park et al. |
| 11,502,229 | B2 | 11/2022 | Kang et al. |
| 11,815,258 | B2 | 11/2023 | Park et al. |
| 2010/0079977 | A1* | 4/2010 | Lee .................. G02F 1/133611 362/97.1 |
| 2014/0009944 | A1 | 1/2014 | Fukuda |
| 2014/0111970 | A1* | 4/2014 | Lu .................... G02F 1/133611 362/97.1 |
| 2014/0146518 | A1* | 5/2014 | Chen ................. G02F 1/133603 362/84 |
| 2021/0082883 | A1 | 3/2021 | Yang |
| 2021/0408346 | A1 | 12/2021 | Lin et al. |

FOREIGN PATENT DOCUMENTS

| | | | |
|---|---|---|---|
| JP | 2014-13688 | A | 1/2014 |
| JP | 2015-18947 | A | 1/2015 |
| JP | 5726331 | B2 | 5/2015 |
| JP | 2018-181726 | A | 11/2018 |
| KR | 10-2008-0023007 | A | 3/2008 |
| KR | 10-2008-0029386 | A | 4/2008 |
| KR | 20-2011-0008114 | U | 8/2011 |
| KR | 10-1103815 | B1 | 1/2012 |
| KR | 10-1289069 | B1 | 7/2013 |
| KR | 10-1374895 | B1 | 3/2014 |
| KR | 10-1464654 | B1 | 11/2014 |
| KR | 10-2018-0036272 | A | 4/2018 |
| KR | 20180036272 | A * | 4/2018 |
| KR | 10-2019-0002907 | A | 1/2019 |
| KR | 10-2019-0109221 | A | 9/2019 |
| KR | 10-2020-0034471 | A | 3/2020 |
| KR | 10-2021-0116828 | A | 9/2021 |
| KR | 10-2022-0026919 | A | 3/2022 |
| KR | 10-2022-0056069 | A | 5/2022 |

OTHER PUBLICATIONS

Written Opinion (PCT/ISA/237) issued on Aug. 30, 2023 by the International Searching Authority in International Patent Application No. PCT/KR2023/005262.

* cited by examiner

DISPLAY APPARATUS

CROSS-REFERENCE TO RELATED APPLICATION(S)

This application is a continuation application of International Application No. PCT/KR2023/005262, filed on Apr. 19, 2023, which claims priority to Korean Patent Application No. 10-2022-0077848, filed on Jun. 24, 2022, and Korean Patent Application No. 10-2022-0106277, filed on Aug. 24, 2022, in the Korean Intellectual Property Office, the disclosures of which are incorporated by reference herein in their entireties

BACKGROUND

1. Field

The disclosure relates to a display apparatus including a backlight unit.

2. Description of Related Art

A display apparatus is an output device that converts obtained or stored electrical information into visual information and displays the visual information to a user.

The display apparatus may include a liquid crystal panel, and a backlight unit (BLU) configured to provide light to the liquid crystal panel.

The backlight unit may include a bar-type substrate, and a plurality of point light sources disposed on the substrate.

SUMMARY

Provided is a display apparatus including a backlight unit that includes a bar-type substrate and provides uniform luminance.

Provided is a display apparatus including a backlight unit which improves luminance non-uniformity caused by a difference between a distance between two adjacent substrates and a distance between two adjacent light sources on a substrate.

Provided is a backlight unit which includes a light source configured to allow an amount of light emitted in a first direction to be greater than an amount of light emitted in a second direction perpendicular to the first direction, and a display apparatus including the same.

In accordance with an aspect of the disclosure, a display apparatus includes: a liquid crystal panel; and a backlight unit configured to emit light to the liquid crystal panel. The backlight unit includes: a substrate extending along a first direction; a light emitting diode provided on the substrate; a refractive cover provided on the light emitting diode to refract light emitted from the light emitting diode; and a lens provided on the substrate and the refractive cover, the lens comprising a bottom surface having a first length in the first direction that is less than a second length in a second direction perpendicular to the first direction.

A receiving groove may be formed in the lens defines a receiving space, and the refractive cover may be provided in the receiving space.

The refractive cover may be spaced apart from the lens within the receiving space.

A length of the receiving groove in the first direction may be greater than a length of the receiving groove in the second direction.

The lens may be an anisotropic lens configured to emit more light in the second direction than in the first direction.

The light emitting diode may include a plurality of light emitting diodes spaced apart from each other at a first distance along the first direction, and the substrate may include a plurality of substrates spaced apart from each other at a second distance along the second direction.

The refractive cover may include a plurality of refractive covers provided to cover the plurality of light emitting diodes, and the lens may include a plurality of lenses provided to cover the plurality of refractive covers.

The first distance may be at least fifty percent greater than the second distance.

The lens may include a plurality of lenses provided to cover the plurality of light emitting diodes, and a connector connecting two or more of the plurality of lenses.

The display apparatus may further include a reflective sheet disposed between the liquid crystal panel and the backlight unit, and provided to cover the plurality of substrates. A plurality of holes may be formed through the reflective sheet to allow the plurality of lenses to pass therethrough.

The display apparatus may further include a plurality of reflective sheets provided between the liquid crystal panel and the backlight unit, and respectively corresponding to the plurality of substrates. The plurality of lenses may extend through a plurality of holes formed through the plurality of reflective sheets.

The refractive cover may be formed by dispensing and curing a transparent material in a liquid state.

The light emitting diode may be mounted on the substrate in a chip on board (COB) method.

The light emitting diode may be configured to emit blue light.

In accordance with an aspect of the disclosure, a display apparatus includes: a first plurality of light emitting diodes arranged on a first substrate that extends in a first direction; and a second plurality of light emitting diodes arranged on a second substrate that extends in the first direction and is spaced apart from the first substrate in a second direction perpendicular to the first direction. A first pitch between the first plurality of light emitting diodes along the first direction is less than a second pitch between the first substrate and the second substrate along the second direction.

The display apparatus of may further include a first lens provided on a first light emitting diode, among the first plurality of light emitting diodes. The first lens may have a first length in the first direction and a second length in the second direction that is greater than the first length.

The display apparatus may further include a refractive cover between the first light emitting diode and the first lens.

The refractive cover may be spaced apart from the first lens.

A first receiving groove may be formed in the first lens, and the first receiving groove may be more elongated in the first direction than in the second direction.

A center of the first lens may be closer to the refractive cover along the first direction than along the second direction.

The display apparatus may further include a liquid crystal display panel, and the first plurality of light emitting diodes and the second plurality of light emitting diodes may be configured to emit light to the liquid crystal display panel.

In accordance with an aspect of the disclosure, a display apparatus includes: a first light emitting diode provided on a substrate adjacent a second light emitting diode along a first direction and a third light emitting diode along a second direction that is perpendicular to the first direction; and a first lens provided on the first light emitting diode. The first lens has a first length in the first direction and a second length in the second direction that is greater than the first length.

The second light emitting diode may be provided on the substrate.

The third light emitting diode may be provided on another substrate.

Additional aspects of the disclosure will be set forth in part in the description which follows and, in part, will be appreciated from the description, or may be learned by practice of the disclosure.

BRIEF DESCRIPTION OF DRAWINGS

These and other aspects, features and advantages of certain embodiments of the present disclosure will be more apparent from the following description, taken in conjunction with the accompanying drawings, in which.

DETAILED DESCRIPTION

Figure 1:
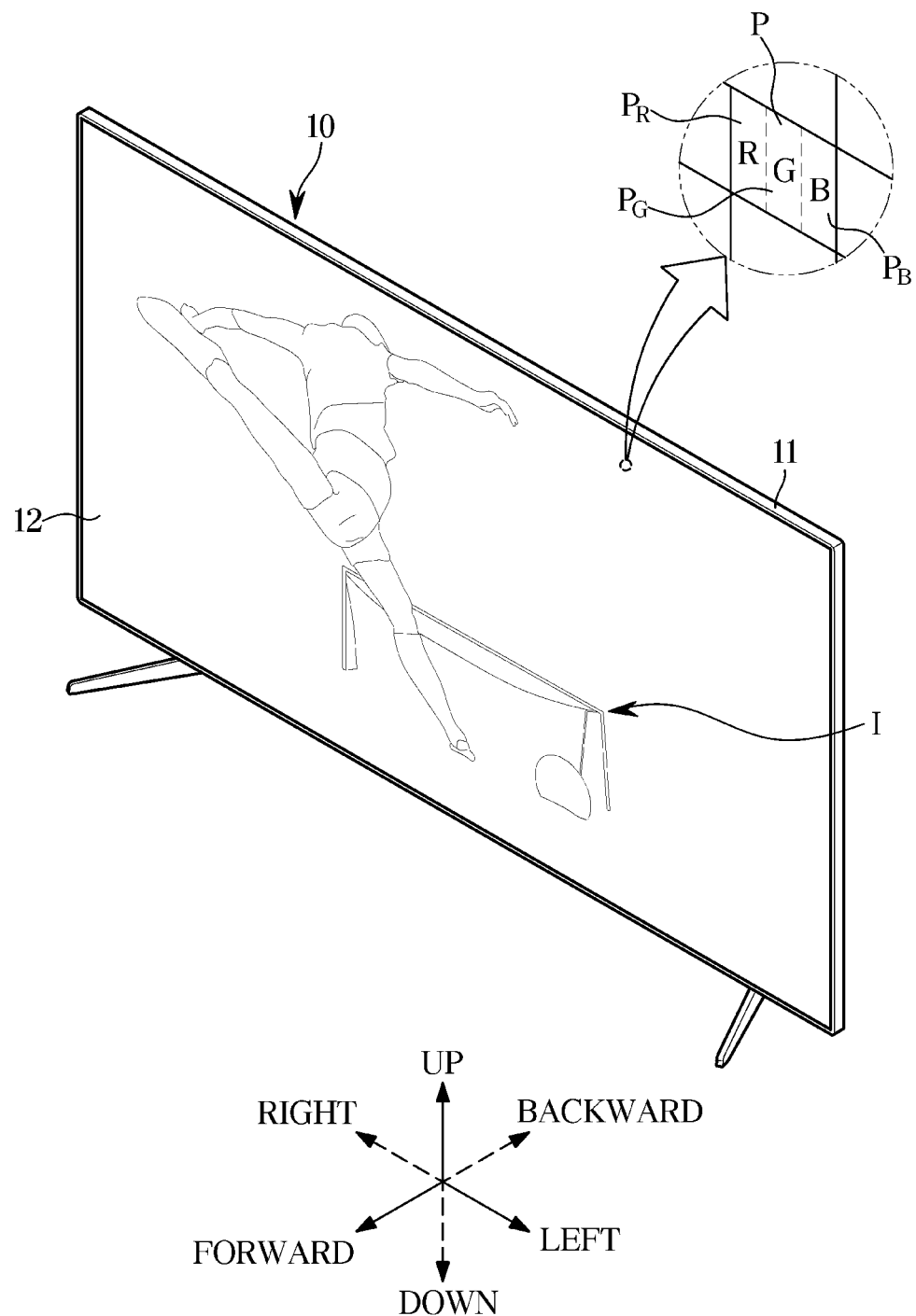
FIG. 1 illustrates an example of an appearance of a display apparatus according to an embodiment.

Embodiments described herein and configurations shown in the drawings are provided as examples, and may be modified in various different ways without departing from the scope of the present disclosure.

In addition, the same reference numerals or signs shown in the drawings indicate elements or components performing substantially the same function.

Also, the terms used herein are used to describe embodiments and are not intended to limit or restrict the disclosure. The singular forms "a," "an" and "the" include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

As used herein, the terms "1st" or "first" and "2nd" or "second" may use corresponding components regardless of importance or order and are used to distinguish a component from another without limiting the components. For example, without departing from the scope of the disclosure, a first element may be termed as a second element, and a second element may be termed as a first element. The term of "and/or" includes a plurality of combinations of relevant items or any one item among a plurality of relevant items. As used herein, expressions such as "at least one from among," when preceding a list of elements, modify the entire list of elements and do not modify the individual elements of the list. For example, the expression, "at least one from among a, b, and c," should be understood as including only a, only b, only c, both a and b, both a and c, both b and c, or all of a, b, and c.

In the following detailed description, the terms of "front", "rear", "left side", "right side", "upper", "lower" and the like may be defined by the drawings, but the shape and the location of the component is not limited by the term.

FIG. 1 illustrates an example of an appearance of a display apparatus according to an embodiment.

Referring to FIG. 1, a display apparatus 10 is a device that processes an image signal, which may be received from an external device, and visually displays an image based on the processed image signal. Hereinafter a case, in which the display apparatus 10 is a television is provided as an example, but the disclosure is not limited thereto. For example, the display apparatus 10 may be implemented in various forms, such as a monitor, a portable multimedia device, and a portable communication device, and the display apparatus 10 is not limited in its shape.

The display apparatus 10 may be a large format display (LFD) installed in various locations, including indoor and outdoor locations. For example, the display apparatus 10 may be provided on a roof of a building or a bus stop. For example, the display apparatus 10 may be installed in subway stations, shopping malls, movie theaters, corporate offices, or stores.

The display apparatus 10 may receive content data including video data and audio data from various content sources, and output video and audio corresponding to the video data and the audio data. For example, the display apparatus 10 may receive content data through a broadcast reception antenna or cable, receive content data from a content playback device, or receive content data from a content providing server of a content provider.

As illustrated in FIG. 1, the display apparatus 10 may include a body 11, and a screen 12 provided to display an image I.

The body 11 may form an appearance of the display apparatus 10, and the body 11 may include a component configured to allow the display apparatus 10 to display the image I and to perform various functions. Although the body 11 shown in FIG. 1 is in the form of a flat plate, the shape of the body 11 is not limited thereto. For example, the body 11 may have a curved plate shape.

The screen 12 may be formed on a front surface of the body 11, and be configured to display the image I. For example, the screen 12 may display a still image or a moving image. Further, the screen 12 may display a two-dimensional plane image or a three-dimensional image using binocular parallax of the user.

The screen 12 may include a non-light emitting panel (e.g., a liquid crystal panel) configured to selectively pass or block light emitted from a backlight unit (BLU) (e.g., a backlight) or the like.

A plurality of pixels P may be formed on the screen 12 and the image I displayed on the screen 12 may be formed by the light emitted from the plurality of pixels P. For example, the image I may be formed on the screen 12 by combining light emitted from the plurality of pixels P as a mosaic.

Each of the plurality of pixels P may emit different brightness and different color of light. In order to emit light in the various colors, the plurality of pixels P may include sub-pixels PR, PG, and PB, respectively.

The sub-pixels PR, PG, and PB may include a red sub pixel PR configured to emit red light, a green sub pixel PG configured to emit green light, and a blue sub pixel PB configured to emit blue light. For example, the red light may represent a light beam having a wavelength of approximately 620 nm (nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red sub pixel PR, the green light of the green sub pixel PG and the blue light of the blue sub pixel PB, each of the plurality of pixels P may emit a different brightness and a different color of light.

Figure 2:
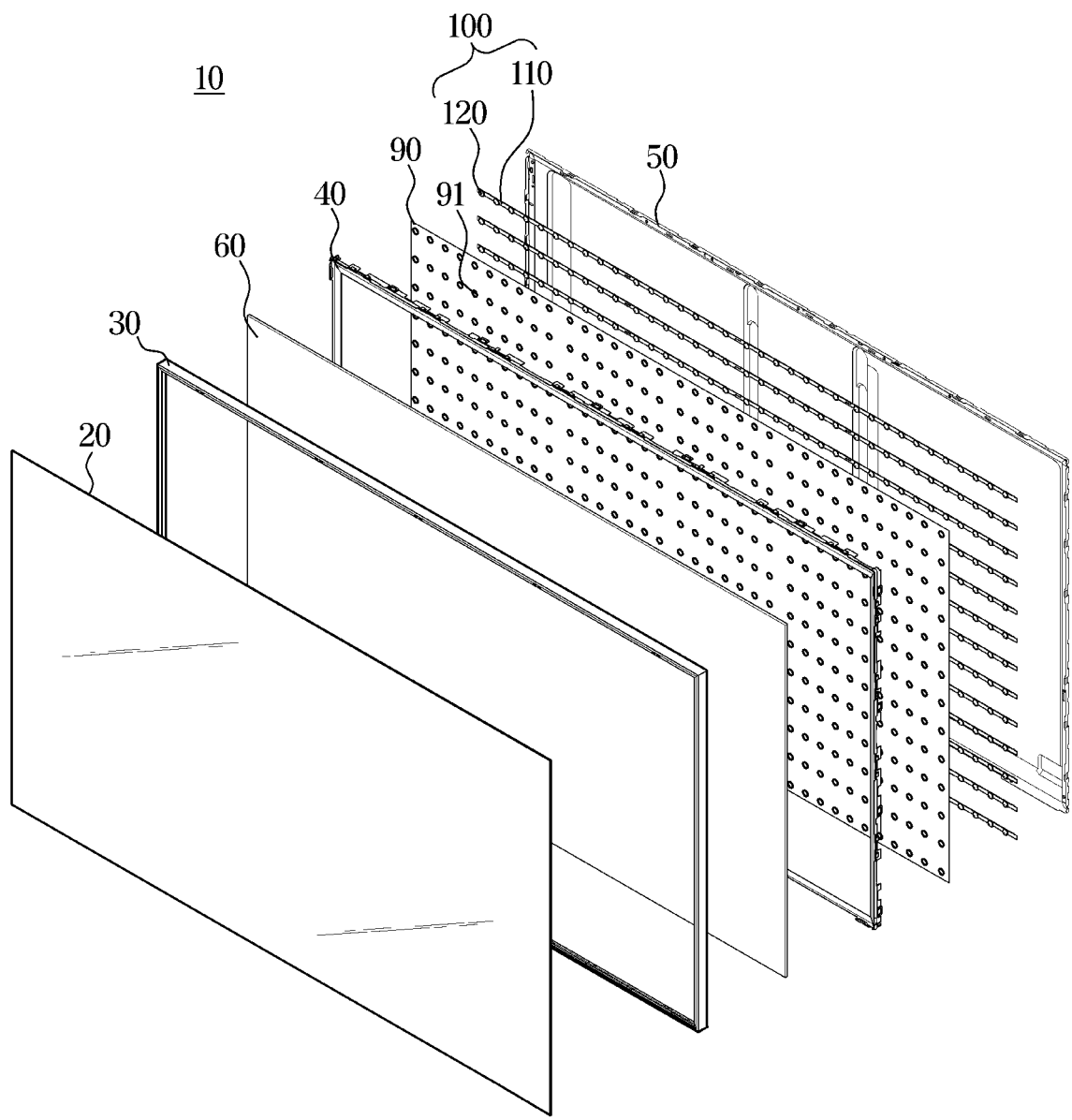
FIG. 2 illustrates an example of a structure of the display apparatus according to an embodiment.
Figure 3:
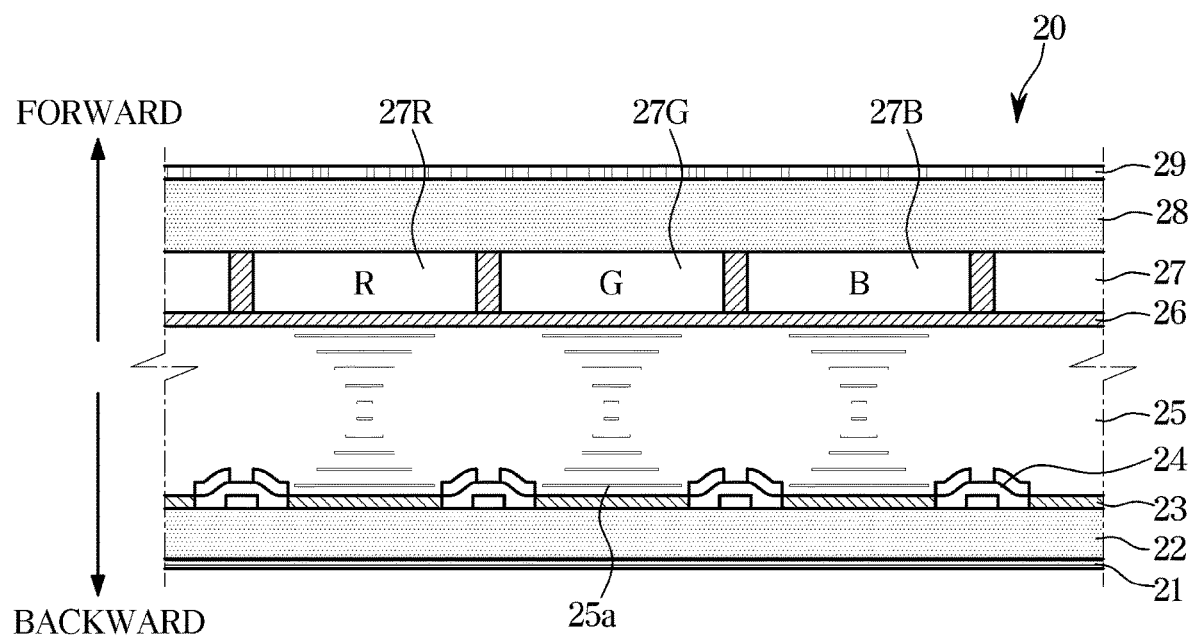
FIG. 3 illustrates an example of a liquid crystal panel included in the display apparatus according to an embodiment.

FIG. 2 illustrates an example of a structure of the display apparatus 10 according to an embodiment, and FIG. 3 illustrates an example of a liquid crystal panel included in the display apparatus 10 according to an embodiment.

The display apparatus 10 may include a backlight unit (BLU) 100, a liquid crystal panel 20 configured to selectively block or pass light emitted from the BLU 100, and a chassis assembly provided to support the liquid crystal panel 20 and the BLU 100. The display apparatus 10 may include an optical member 60 provided between the liquid crystal panel 20 and the BLU 100, and a reflective sheet 90 provided between the optical member 60 and the BLU 100.

The chassis assembly may include a rear chassis 50 provided to support the BLU 100, a front chassis 30 provided in front of the rear chassis 50 to support the liquid crystal panel 20, and a middle mold 40 coupled between the front chassis 30 and the rear chassis 50. The chassis assembly may receive the liquid crystal panel and the BLU 100 therein.

The liquid crystal panel 20 is provided in front of the BLU 100 and blocks or passes light emitted from the BLU 100 to form an image I.

According to an embodiment, a plurality of holes 91 may be formed through the reflective sheet 90, respectively corresponding to a plurality of light sources 120. The reflective sheet 90 may be provided in a plate shape corresponding to a size of the liquid crystal panel 20. The plurality of holes 91 may have a larger diameter than an outer diameter of the light source 120 to allow the light source 120 to pass therethrough.

The reflective sheet 90 may be provided in front of a substrate 110 to allow the plurality of light sources 120 mounted on the substrate 110 to respectively pass through the plurality of holes 91. The reflective sheet 90 may reflect light, which is emitted, reflected, or refracted toward the reflective sheet 90, toward the liquid crystal panel 20.

A front surface of the liquid crystal panel 20 may form the screen 12 of the display apparatus 10 described above, and the liquid crystal panel 20 may form the plurality of pixels P. In the liquid crystal panel 20, the plurality of pixels P may independently block or transmit light from the BLU 100, and the light transmitted through the plurality of pixels P may form the image I displayed on the screen 12.

For example, as shown in FIG. 3, the liquid crystal panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on the outside of the first and second transparent substrates 22 and 28. Each of the first polarizing film 21 and the second polarizing film 29 may transmit a specific light beam and block (reflect or absorb) other light beams. For example, the first polarizing film 21 may transmit light polarized in a first direction and block (reflect or absorb) other polarized light. The second polarizing film 29 may transmit light polarized in a second direction and block (reflect or absorb) other polarized light. In this case, the first direction and the second direction may be perpendicular to each other. Accordingly, light transmitted through the first polarizing film 21 may not be directly transmitted through the second polarizing film 29.

The color filter 27 may be provided on an inner side of the second transparent substrate 28. The color filter 27 may include a red filter 27R which transmits red light, a green filter 27G which transmits green light, and a blue filter 27B which transmits blue light. The red filter 27R, the green filter 27G, and the blue filter 27B may be disposed parallel to each other. A region, in which the color filter 27 is formed, may correspond to the pixel P described above. A region, in which the red filter 27R is formed, may correspond to the red sub-pixel PR, a region, in which the green filter 27G is formed, may correspond to the green sub-pixel PG, and a region, in which the blue filter 27B is formed, may correspond to the blue sub-pixel PB.

The pixel electrode 23 may be provided on the inner side of the first transparent substrate 22, and the common electrode 26 may be provided on the inner side of the second transparent substrate 28. The pixel electrode 23 and the common electrode 26 may be formed of a metal material through which electricity is conducted, and the pixel electrode 23 and the common electrode 26 may generate an electric field to change the arrangement of liquid crystal molecules 25a forming the liquid crystal layer 25 to be described below.

The thin film transistor (TFT) 24 may be provided on the inner side of the second transparent substrate 22. The TFT 24 may be turned on (closed) or turned off (open) by image data provided from a panel driver. In addition, an electric field may be formed or removed between the pixel electrode 23 and the common electrode 26 in response to turning on (closing) or turning off (opening) the TFT 24.

The liquid crystal layer 25 may be formed between the pixel electrode 23 and the common electrode 26, and the liquid crystal layer 25 may be filled with the liquid crystal molecules 25a. Liquid crystals represent an intermediate state between a solid (crystal) and a liquid. Liquid crystals also exhibit optical properties according to changes in an electric field. For example, in the liquid crystal, the orientation of molecules forming the liquid crystal may change according to a change in an electric field. As a result, the optical properties of the liquid crystal layer 25 may vary depending on the presence or absence of the electric field passing through the liquid crystal layer 25. For example, the liquid crystal layer 25 may rotate a polarization direction of light about an optical axis depending on the presence or absence of the electric field. As a result, a polarization direction of the polarized light passing through the first polarizing film 21 may be rotated while passing through the liquid crystal layer 25, and thus the polarized light may pass through the second polarizing film 29.

Figure 4:
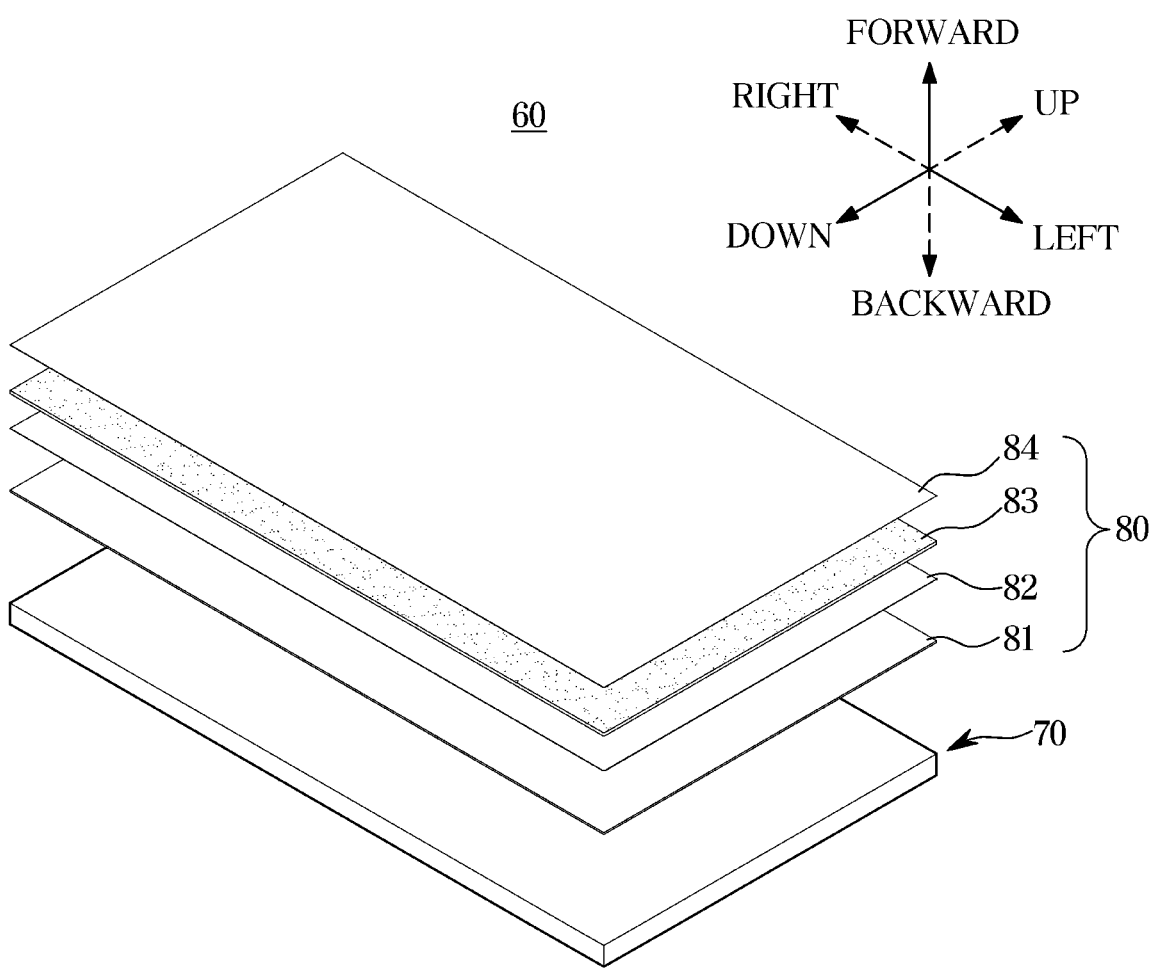
FIG. 4 illustrates an example of an optical sheet and a diffusion plate in the display apparatus according to an embodiment.

FIG. 4 illustrates an example of an optical sheet and a diffusion plate in the display apparatus according to an embodiment.

Referring to FIG. 4, the display apparatus 10 may include the optical member 60 provided between the liquid crystal panel 20 and the BLU 100.

The optical member 60 may include the diffusion plate 70 provided to uniformly diffuse light emitted from the BLU 100, an optical sheet 80 provided in front of the diffusion plate 70 to improve luminance of emitted light.

The diffusion plate 70 may be provided in front of the BLU 100, and may evenly distribute the light emitted from the light source 120 of the BLU 100.

Within the diffusion plate 70, the diffusion plate 70 may diffuse light emitted from the plurality of light sources 120 to remove unevenness in luminance caused by the plurality of light sources 120. In this regard, the diffusion plate 70 may diffuse uneven light emitted from the plurality of light sources 120, thereby relatively and uniformly emitting the light to the front surface.

The optical sheet 80 may include various sheets for improving luminance and luminance uniformity. For example, the optical sheet 80 may include a light conversion sheet 81, a diffusion sheet 82, a prism sheet 83, and a reflective polarizing sheet 144.

The optical sheet 80 is not limited to the sheet or film shown in FIG. 4, and may include more various sheets, such as a protective sheet, or films.

Figure 5:
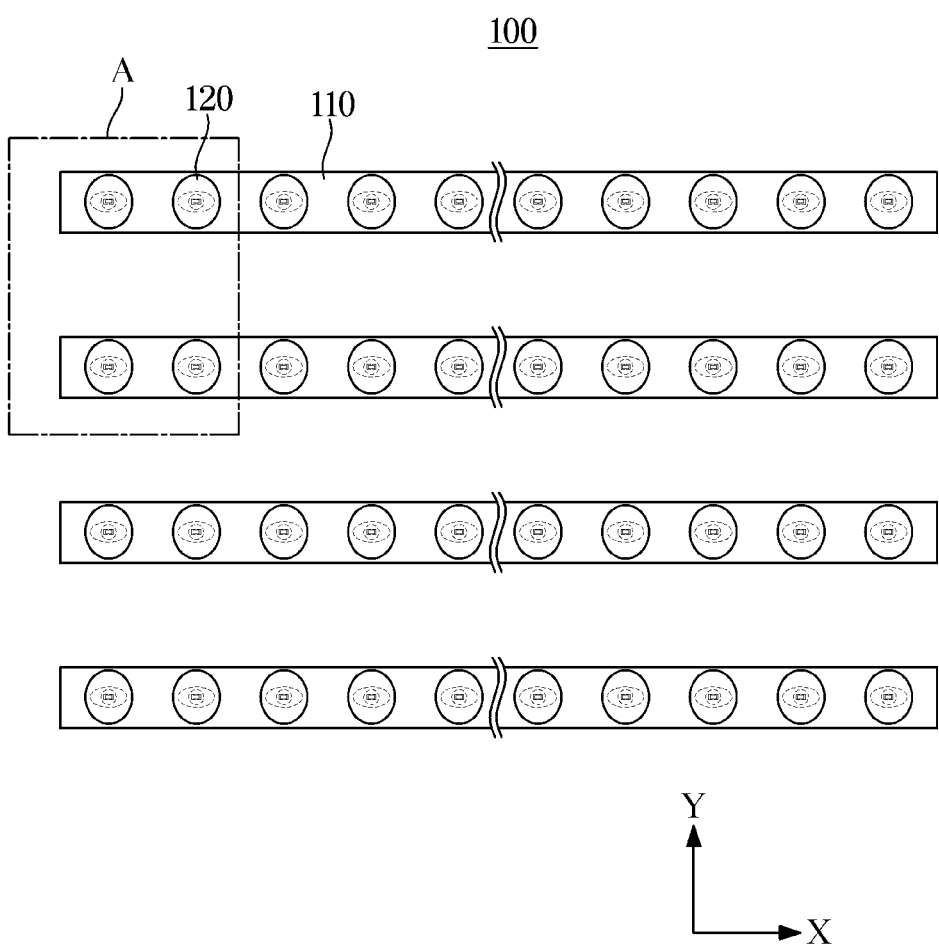
FIG. 5 is a view illustrating a backlight unit in the display apparatus according to an embodiment.
Figure 6:
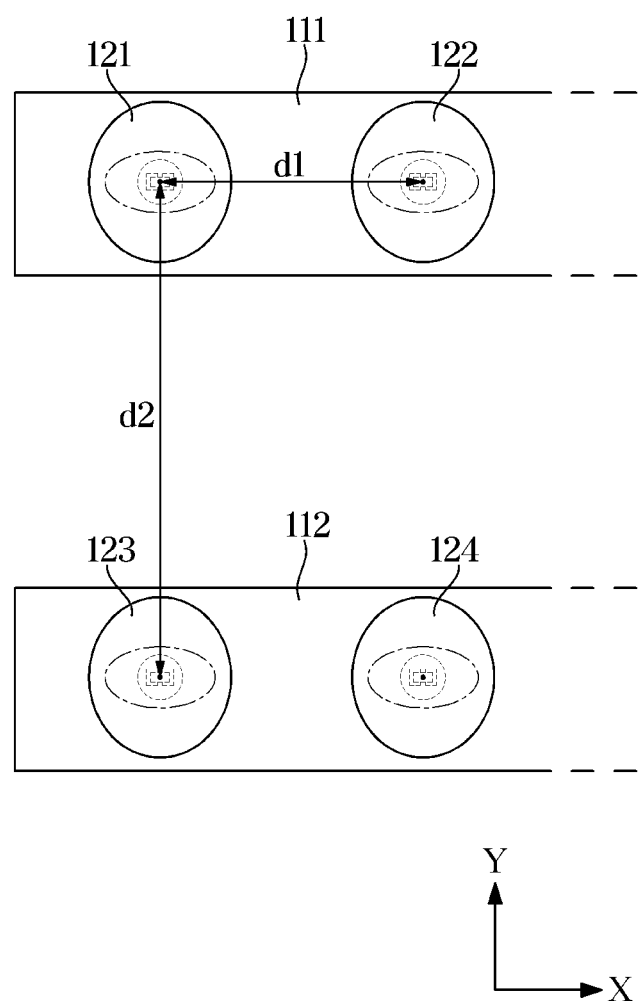
FIG. 6 is an enlarged view of portion A of FIG. 5.

FIG. 5 is a view illustrating a backlight unit in the display apparatus according to an embodiment, and FIG. 6 is an enlarged view of portion A of FIG. 5.

Referring to FIGS. 5 and 6, an arrangement of the plurality of substrates 110 and the plurality of light sources 120 in the BLU 100 according to an embodiment will be described with reference to FIGS. 5 and 6. Hereinafter a X-direction illustrated in FIGS. 5 and 6 may represent a first direction and a Y-direction illustrated in FIGS. 5 and 6 may represent a second direction.

The BLU 100 may include the substrate 110 extending along the first direction X, and the plurality of light sources 120 spaced apart from each other along the first direction on the substrate 110. The BLU 100 may include the plurality of substrates 110 spaced apart from each other along the second direction Y perpendicular to the first direction. Hereinafter the substrate 110 extending along one direction is referred to as a bar-type substrate.

Referring to FIG. 6, in a first substrate 111 and a second substrate 112 adjacent to each other among the plurality of substrates 110, two light sources 121 and 122 adjacent to each other in the first direction X may be spaced apart at a first distance d1. The plurality of light sources 120 may include the first light source 121 and the second light source 122 mounted on the first substrate 111, and a third light source 123 and a fourth light source 124 mounted on the second substrate 112. The first light source 121 and the third light source 123 in accordance with the second direction Y may be spaced apart at a second distance d2. Similarly, the second light source 122 and the fourth light source 124 may be spaced apart at the second distance d2. In this regard, the light plurality of light sources 120 may be arranged to have a first pitch, which corresponds to the first distance d1, along the first direction X and a second pitch, which corresponds to the second distance d2, along the second direction Y.

The first light source 121 and the second light source 122 mounted on the first substrate 111 may be spaced apart from each other at the first distance d1 in the first direction X. The third light source 123 and the fourth light source 124 mounted on the second substrate 112 may be spaced apart from each other at the first distance d1 in the first direction X.

As mentioned above, the BLU 100 according to an embodiment may include the plurality of substrates 110 spaced apart at the second distance d2 in the second direction Y and the plurality of light sources 120 spaced apart at the first distance d1 in the first direction X. The BLU 100 may be provided to allow the first distance d1 and the second distance d2 to satisfy a formula of $d2 > 1.5 \ast d1$. In this regard, the second distance d2 between the two adjacent substrates 111 and 112 may be greater than 1.5 times the first distance d1 between the two adjacent light sources 121 and 122 or 123 and 124.

In general, the BLU including the plurality of bar-type substrates, and the plurality of light sources mounted to the plurality of bar-type substrates may include relatively small number of light sources when compared with a backlight unit including a single substrate formed in a size corresponding to a size of a liquid crystal panel, and a plurality of light sources mounted on the substrate.

In order to simplify manufacturing and reduce components of the BLU including the bar-type substrate, the distance between the substrates may be increased. For example, the distance between the substrates in the second direction Y may be greater than the distance between light sources mounted on each substrate in the first direction X.

However, when the distance between the substrates is greater than the distance between the light sources within the substrate, the luminance uniformity of the backlight unit may be deteriorated. Because the distance between two adjacent substrates is greater than the distance between two adjacent light sources within the substrate, the luminance may be insufficient between the two substrates, and a dark Mura defect may occur between the two substrates.

Figure 7:
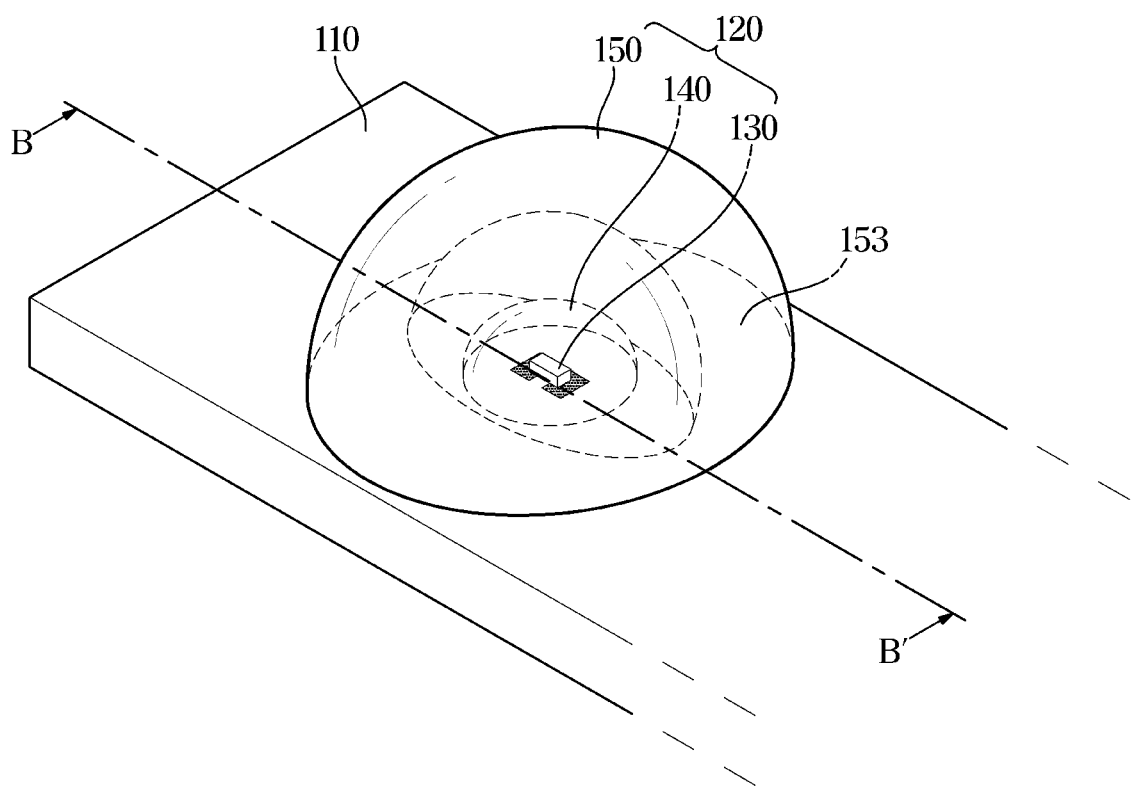
FIG. 7 is a view illustrating a substrate, a light emitting diode, a refractive cover and a lens in the display apparatus according to an embodiment.
Figure 8:
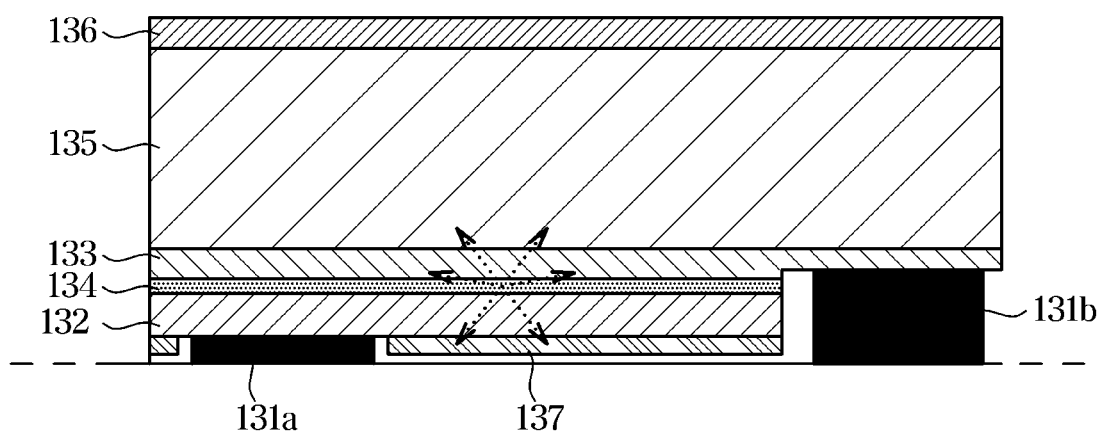
FIG. 8 illustrates an example of a cross section of the light emitting diode taken along line B-B' in FIG. 7.
Figure 9:
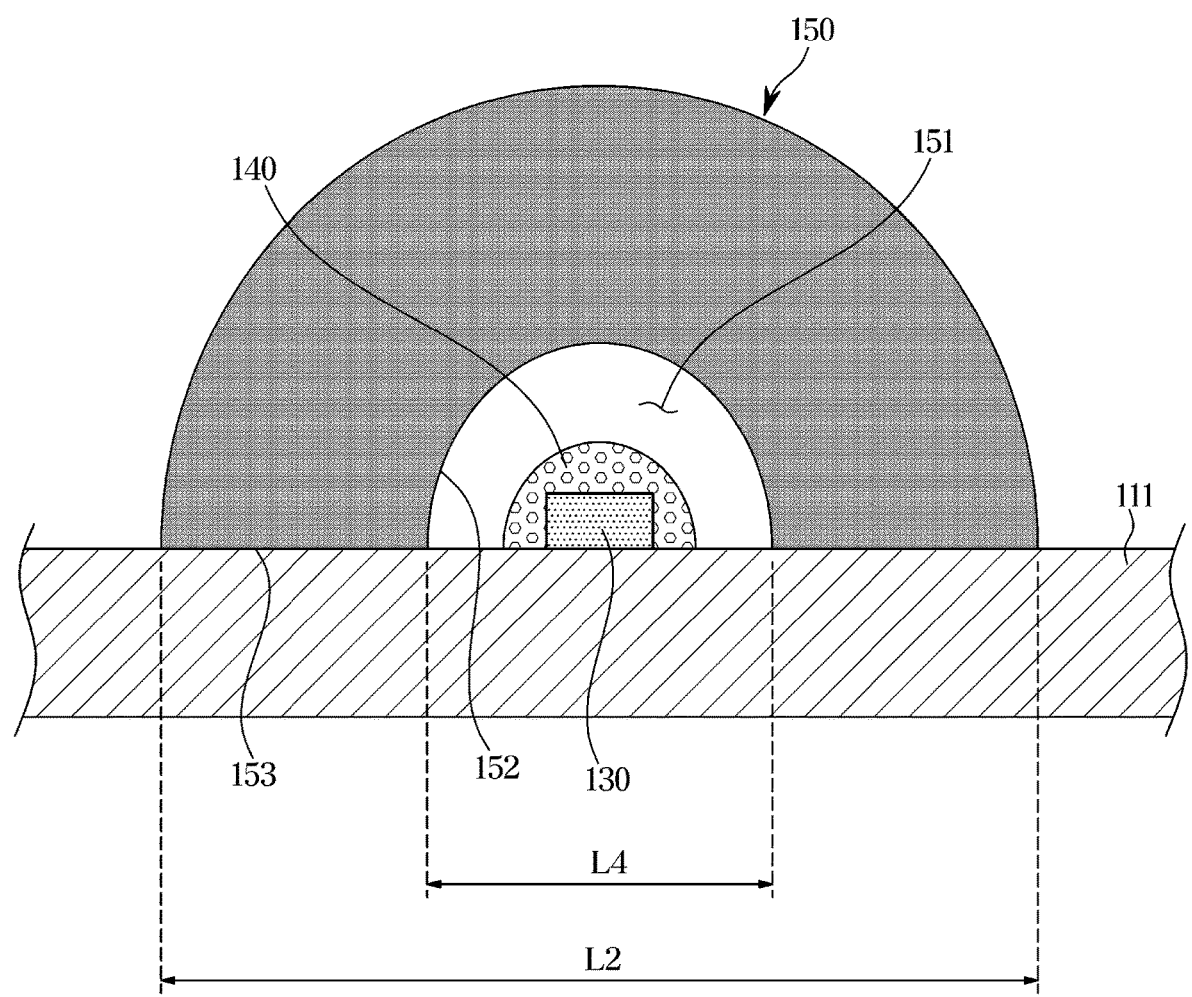
FIG. 9 is a sectional view taken along line B-B' of FIG. 7.
Figure 10:
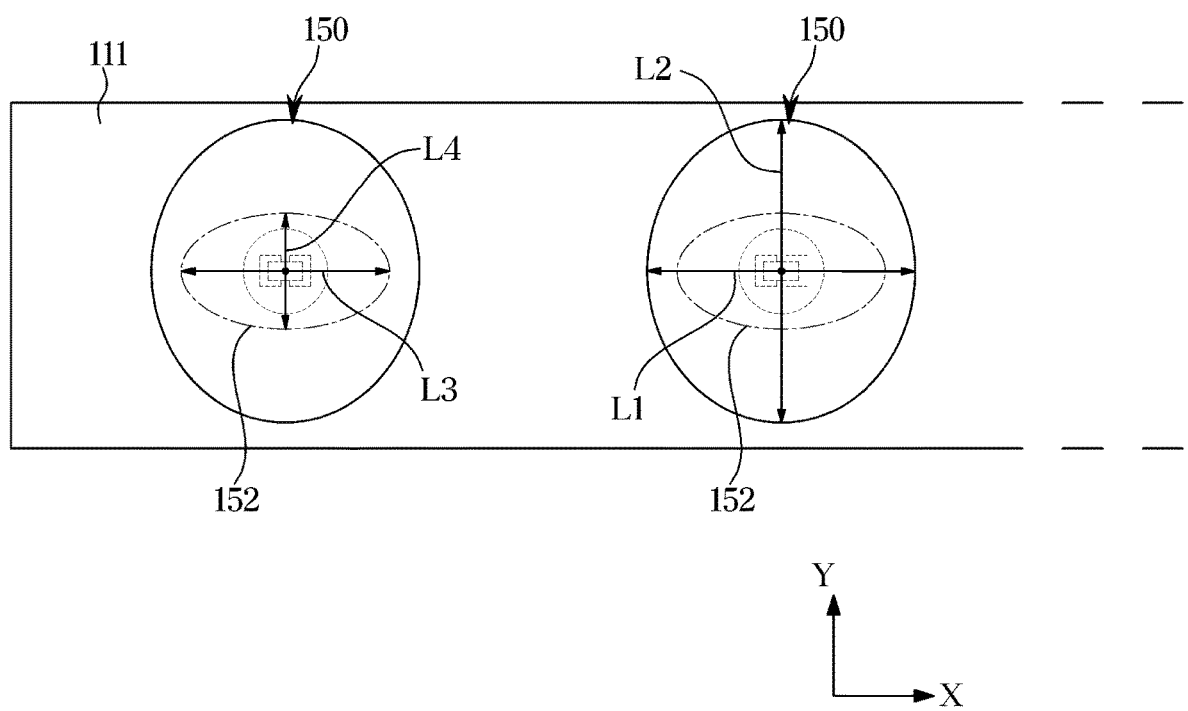
FIG. 10 is a view illustrating a length of a bottom surface of the lens and a length of a bottom surface of a receiving groove in the display apparatus according to an embodiment.
Figure 11:
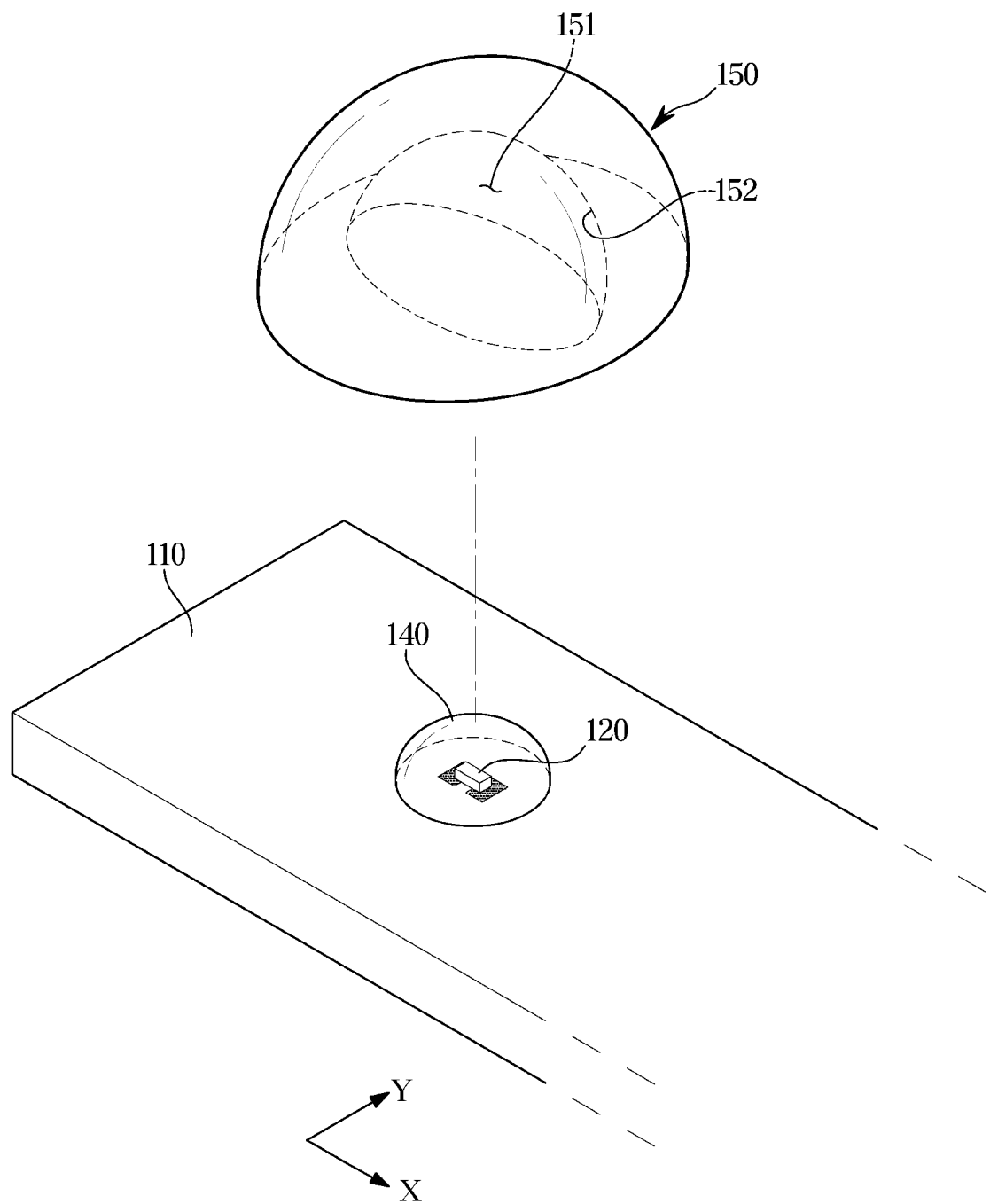
FIG. 11 illustrates a state in which the lens is separated from the light emitting diode and the refractive cover in the light source illustrated in FIG. 7.

FIG. 7 is a view illustrating a substrate, a light emitting diode, a refractive cover and a lens in the display apparatus according to an embodiment. FIG. 8 illustrates an example of a cross section of the light emitting diode taken along line B-B' in FIG. 7. FIG. 9 is a sectional view taken along line B-B' of FIG. 7. FIG. 10 is a view illustrating a length of a bottom surface of the lens and a length of a bottom surface of a receiving groove in the display apparatus according to an embodiment. FIG. 11 illustrates a state in which the lens is separated from the light emitting diode and the refractive cover in the light source illustrated in FIG. 7.

Referring to FIG. 7, the BLU 100 may include the bar-type substrate 110, and the light source 120 disposed on the substrate 110. The light source 120 may include a light emitting diode 130 mounted on the substrate 110, a refractive cover 140 covering the light emitting diode 130, and a lens 150 covering the refractive cover 140.

The light emitting diode 130 may be directly mounted on the substrate 110. Particularly, the light emitting diode 130 may be directly mounted on the substrate 110 in a Chip On Board (COB) method without a separate package. The light emitting diode 130 may be configured to emit blue-based light.

Referring to FIG. 8, the light emitting diode 130 may include a transparent substrate 135, an n-type semiconductor layer 133, and a p-type semiconductor layer 132. In addition, a multi quantum well (MQW) layer 134 is formed between the n-type semiconductor layer 133 and the p-type semiconductor layer 132.

The transparent substrate 135 may be a base of a p-n junction capable of emitting light. For example, the transparent substrate 135 may include sapphire ($Al_2O_3$) including a crystal structure similar to that of the semiconductor layers 133 and 132.

By bonding the n-type semiconductor layer 133 and the p-type semiconductor layer 132, a p-n junction may be implemented. A depletion layer may be formed between the n-type semiconductor layer 133 and the p-type semiconductor layer 132. In the depletion layer, electrons of the n-type semiconductor layer 133 and holes of the p-type semiconductor layer 132 may recombine. Light may be emitted by recombination of electrons and holes.

For example, the n-type semiconductor layer 133 may include n-type gallium nitride (n-type GaN). In addition, the p-type semiconductor layer 132 may include p-type gallium nitride (p-type GaN). An energy band gap of gallium nitride (GaN) is about 3.4 eV (electron volt), which emits light with a wavelength shorter than 400 nm. Accordingly, deep blue or ultraviolet light may be emitted from the junction of the n-type semiconductor layer 133 and the p-type semiconductor layer 132.

The n-type semiconductor layer 133 and the p-type semiconductor layer 132 are not limited to gallium nitride, and various semiconductor materials may be used according to light that is required.

A first electrode 131a of the light emitting diode 130 is in electrical contact with the p-type semiconductor layer 132, and a second electrode 131b is in electrical contact with the n-type semiconductor layer 133. The first electrode 131a and the second electrode 131b may function not only as electrodes but also as reflectors that reflect light.

When a voltage is applied to the light emitting diode 130, holes may be supplied to the p-type semiconductor layer 132 through the first electrode 131a, and electrons may be supplied to the n-type semiconductor layer 133 through the second electrode 131b. The electrons and holes may recombine in the depletion layer formed between the p-type semiconductor layer 132 and the n-type semiconductor layer 133. At this time, while electrons and holes recombine, energy (e.g., kinetic energy and potential energy) of electrons and holes may be converted into light energy. In this regard, when electrons and holes recombine, light may be emitted.

At this time, the energy band gap of the quantum well layer 134 is less than that of the p-type semiconductor layer 132 and/or the n-type semiconductor layer 133. As a result, holes and electrons may be trapped in the quantum well layer 134, respectively.

The holes and electrons trapped in the quantum well layer 134 may easily recombine with each other in the quantum well layer 134. As a result, efficiency of light generation of the light emitting diode 130 may be improved.

Light having a wavelength corresponding to the energy gap of the quantum well layer 134 may be emitted from the quantum well layer 134. For example, blue light between 420 nm and 480 nm may be emitted from the quantum well layer 134. As such, the quantum well layer 134 may correspond to a light emitting layer configured to emit blue light.

A first reflective layer 136 may be disposed on an outer side (an upper side of the transparent substrate as illustrated in FIG. 8) of the transparent substrate 135. That is, the first reflective layer 136 may be disposed on the upper side of the light emitting layer 134. In addition, a second reflective layer 137 may be disposed on a lower side (a lower side of the p-type semiconductor layer as illustrated in FIG. 8) of the p-type semiconductor layer 132. Accordingly, the transparent substrate 135, the n-type semiconductor layer 133, the quantum well layer 134, and the p-type semiconductor layer 132 may be disposed between the first reflective layer 136 and the second reflective layer 137.

The first reflective layer 136 and the second reflective layer 137 may each reflect a portion of the light incident thereon, and pass another portion of the light incident thereon.

For example, the first reflective layer 136 and the second reflective layer 137 may reflect light having a wavelength included in a specific wavelength range, and pass light having a wavelength outside the specific wavelength range. For example, the first reflective layer 136 and the second reflective layer 137 may reflect blue light having a wavelength between 420 nm and 480 nm emitted from the quantum well layer 134.

In addition, the first reflective layer 136 and the second reflective layer 137 may reflect incident light having a specific incident angle, and pass light outside the specific incident angle. For example, the first reflective layer 136 and the second reflective layer 137 may be Distributed Bragg Reflector (DBR) layers including materials having different refractive indices so as to have various reflexibilities according to incident angles.

For example, the first reflective layer 136 may reflect light incident at a small incident angle, and pass light incident at a large incident angle. In addition, the second reflective layer 137 may reflect or pass light incident at a small incident angle, and reflect light incident at a large incident angle. The incident light may be blue light having a wavelength between 420 nm and 480 nm.

Referring to FIGS. 7 and 9, the BLU 100 may include a refractive cover 140 provided to cover the light emitting diode 130 to refract light emitted from the light emitting diode 130.

The refractive cover 140 may be formed by dispensing a liquid transparent material on the light emitting diode 130 and then curing the dispensed liquid transparent material. The transparent material may include silicon. The refractive cover 140 may be formed by dispensing and curing the liquid transparent material at one point or at a plurality of points on the light emitting diode 130. The refractive cover 140 may refract light emitted from the light emitting diode 130. The refractive cover 140 may be provided to surround the light emitting diode 130. The refractive cover 140 may be referred to as a silicone dome.

Referring to FIGS. 7 and 9-11, the BLU 100 may include the lens 150 provided to cover the refractive cover 140.

The lens 150 may be coupled to the substrate 110 to cover the refractive cover 140. The lens 150 may be coupled to the substrate 110 in a variety of methods. For example, the lens 150 may be coupled to be fixed to the substrate 110 by an adhesive.

The lens 150 may include a receiving groove 152 formed by being recessed upward from a bottom surface 153, and a receiving space 151 formed inside the receiving groove 152.

Referring to FIG. 10, the lens 150 may be provided in such a way that a length L2 of the bottom surface 153 in the second direction Y is greater than a length L1 in the first direction X. The lens 150 may be provided in such a way that a length L3 of a bottom surface of the receiving groove 152 in the first direction X is greater than a length L4 in the second direction Y.

The lens 150 may accommodate the refractive cover 140 in the receiving space 151 formed by the receiving groove 152. The receiving space 151 may be provided to be larger than a volume of the refractive cover 140. Accordingly, within the receiving space 151, the refractive cover 140 may be spaced apart from the lens 150.

The lens 150 may be configured to emit light, which is emitted from the light emitting diode 130 to the receiving groove 152 through the refractive cover 140, toward the front side. Particularly, the lens 150 may be configured to emit light, which is incident on the receiving groove 152. More light may be emitted in the second direction Y than in the first direction X. The lens 150 may be an anisotropic lens configured to allow an amount of light emitted in the second direction to be greater than an amount of light emitted in the first direction.

Because the lens 150 is configured to emit more light in the second direction than in the first direction, the light sources 120 may emit the greater amount of light in the second direction than in the first direction. As mentioned above, the second distance d2 between the two light sources 121 and 123 or 122 and 124 corresponding to each other on the two adjacent substrates 111 and 112 may be 1.5 times larger than the first distance d1 between the two adjacent light sources 121 and 122 or 123 and 124 within one substrate 111. Because the second distance d2 is greater than the first distance d1, an amount of light between the two substrates may be insufficient, which may cause a dark Mura defect.

According to an embodiment, by including the light source 120 configured to emit more light toward between the substrates, a sufficient amount of light may be emitted to remove or reduce a dark Mura defect. That is, the luminance uniformity of the BLU 100 may be improved.

Figure 12:
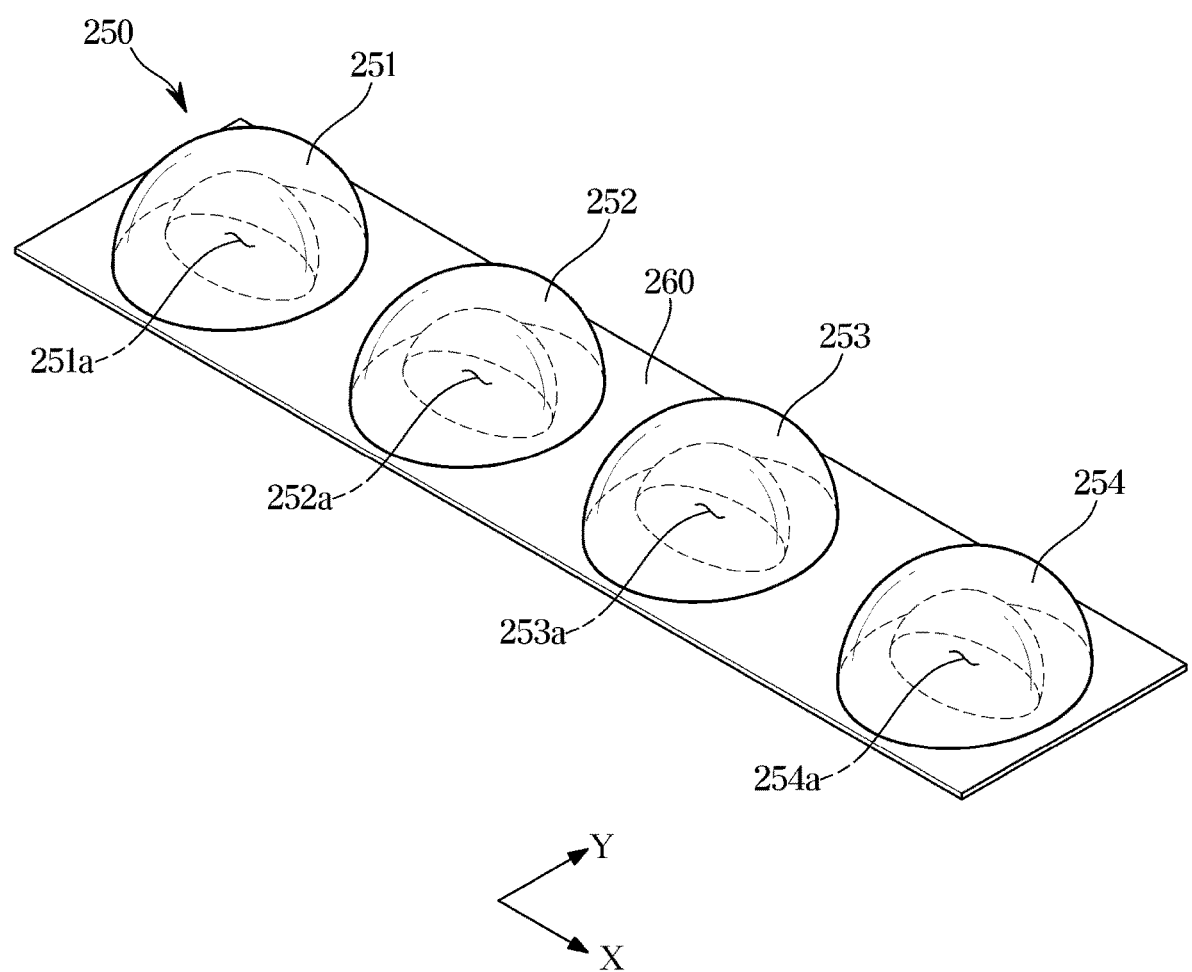
FIG. 12 is a view illustrating the lens separated from the display apparatus according to an embodiment.

FIG. 12 is a view illustrating the lens separated from the display apparatus according to an embodiment.

Referring to FIG. 12, the BLU 100 according to an embodiment may include a package lens 250 formed by connecting the plurality of lenses.

The package lens 250 may cover two or more refractive covers 140 as a unit. The package lens 250 may be formed by connecting two or more lenses to cover the two or more refractive covers 140 as a unit. For example, four lenses 251, 252, 253, and 254 may be connected to each other to form the package lens 250. In the package lens 250, bottom surfaces of the plurality of lenses may be connected to each other. Light may move inside the package lens 250 because the plurality of lenses is connected to each other. Due to the feature, the package lens 250 may be referred to as a tunnel-type lens.

According to an embodiment, the package lens 250 may include a first lens 251, a second lens 252, a third lens 253, and a fourth lens 254. The lenses 251, 252, 253, and 254 may respectively include receiving spaces 251a, 252a, 253a, and 254a therein. The package lens 250 may include a connector 260 connecting bottom surfaces of the lenses 251, 252, 253, and 254 to each other.

The package lens 250 may formed to cover the plurality of refractive covers 140 in one process, and thus the productivity may be relatively increased. The package lens 250 may be coupled to the substrate 110 by coupling the connector 260 to the substrate 110. For example, the package lens 250 may be coupled to the substrate 110 by attaching the connector 260 to the substrate 110 using an adhesive.

Each of the plurality of lenses 251, 252, 253, and 254 included in the package lens 251 may have a structure similar to the lens 150 described above. In this regard, a bottom surface of each of the plurality of lenses 251, 252, 253, and 254 may have a length in the second direction Y greater than a length in the first direction X. A bottom surface of the receiving groove of the plurality of lenses 251, 252, 253, and 254 may have a length in the first direction X greater than a length in the second direction Y.

Figure 13:
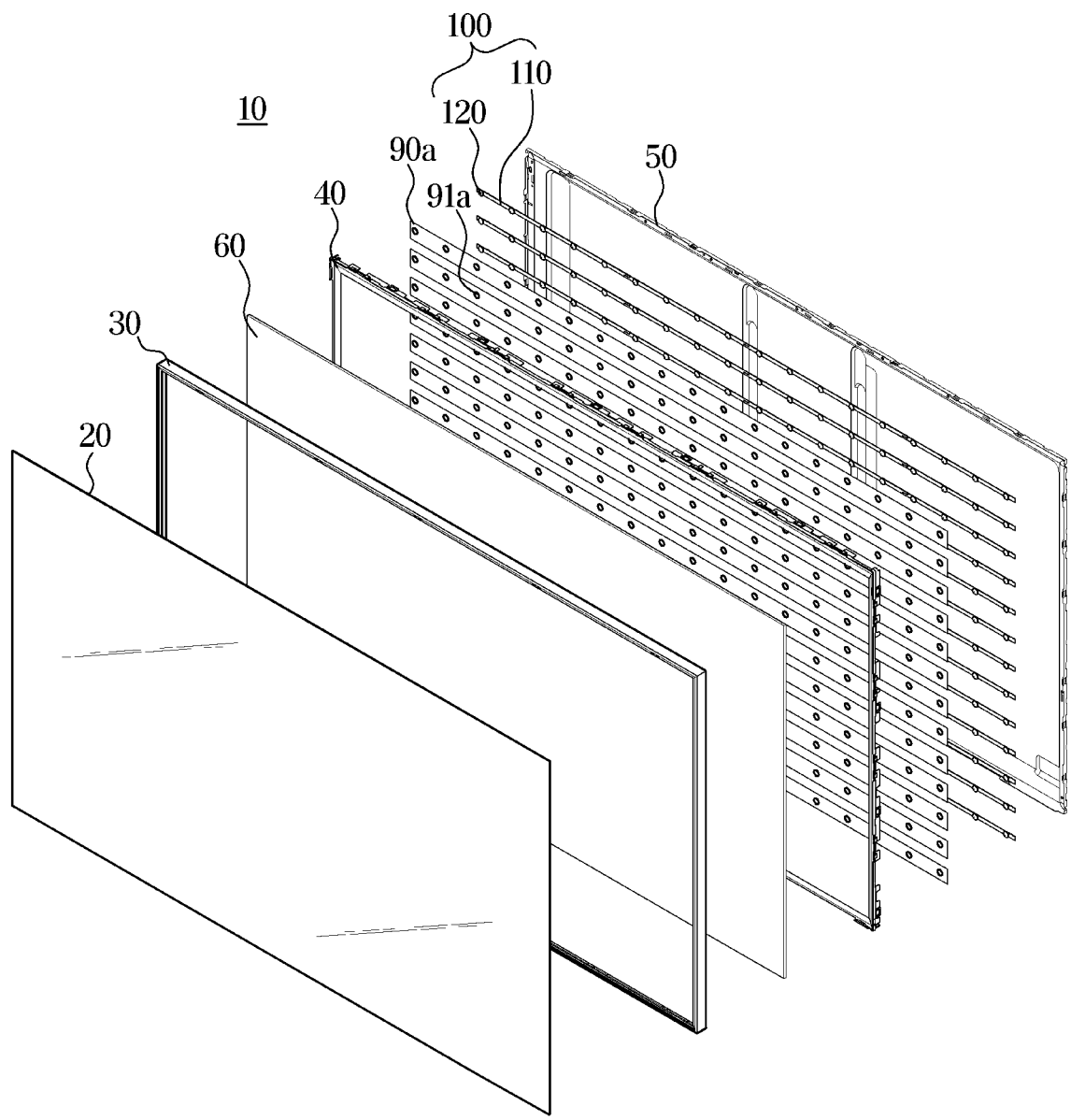
FIG. 13 illustrates an example of a structure of the display apparatus according to an embodiment.

FIG. 13 illustrates an example of a structure of the display apparatus according to an embodiment.

The display apparatus 10 according to an embodiment may include a plurality of reflective sheets 90a.

Referring to FIG. 13, the display apparatus 10 may include the plurality of substrates 110 and the plurality of reflective sheets 90a respectively corresponding to each other. The plurality of reflective sheets 90a may each extend along the direction in which the plurality of substrates 110 extend. The reflective sheet 90a may extend along the first direction X (refer to FIG. 5). The reflective sheet 90a may be provided in a shape corresponding to the substrate 110 to cover the substrate 110.

The reflective sheet 90a may include a plurality of holes 91a. Each of the plurality of holes 91a may have a larger diameter than an outer diameter of the light source 120 to allow the light source 120 to pass therethrough. Particularly, each of the plurality of holes 91a may have a larger diameter than the outer diameter of the lens 150 to allow the lens 150 to pass through each of the plurality of holes 91a.

The reflective sheet 90a may be provided in front of the substrate 110 to allow each of the plurality of light sources 120 mounted on the substrate 110 to pass through each of the plurality of holes 91a. The reflective sheet 90a may reflect light, which is emitted, reflected, or refracted toward the reflective sheet 90a, toward the liquid crystal panel 20.

As is apparent from the above description, a display apparatus may include a backlight unit having uniform luminance and a bar-type substrate.

A display apparatus may include a backlight unit configured to improve luminance non-uniformity caused by a difference between a distance between two adjacent substrates and a distance between two adjacent light sources on a substrate.

A backlight unit may include a light source configured to allow an amount of light emitted in a first direction to be greater than an amount of light emitted in a second direction perpendicular to the first direction.

While aspects of embodiments have been particularly shown and described, it will be understood that various changes in form and details may be made therein without departing from the spirit and scope of the following claims.

What is claimed is:

1. A display apparatus, comprising:
   a liquid crystal panel; and
   a backlight unit configured to emit light to the liquid crystal panel,
   wherein the backlight unit comprises:
   a substrate extending along a first direction;
   a first light emitting diode provided on the substrate;
   a second light emitting diode provided on the substrate,
   wherein the first light emitting diode and the second light emitting diode are arranged in the first direction;

a first refractive cover provided on the first light emitting diode to refract light emitted from the first light emitting diode;

a second refractive cover provided on the second light emitting diode to refract light emitted from the second light emitting diode; and a package lens provided on the substrate, the first refractive cover and the second refractive cover, the package lens comprising a first lens on the first refractive cover, a second lens on the second refractive cover, and a connector, wherein the first lens and the second lens each comprise a bottom surface having a first length in the first direction that is less than a second length in a second direction perpendicular to the first direction, wherein the connector connects the bottom surface of the first lens and the bottom surface of the second lens, wherein the connector is coupled to the substrate and extends along the first direction, wherein a receiving groove formed in each of the first lens and the second lens defines a receiving space, wherein the first refractive cover comprises a curved outer surface that is spaced apart from the first lens within the receiving space, and wherein the second refractive cover comprises a curved outer surface that is spaced apart from the second lens within the receiving space.

2. The display apparatus of claim 1, wherein a length of the receiving groove in the first direction is greater than a length of the receiving groove in the second direction.

3. The display apparatus of claim 1, wherein the first lens is an anisotropic lens configured to emit more light in the second direction than in the first direction.

4. The display apparatus of claim 1, wherein the first light emitting diode and the second light emitting diode are spaced apart from each other at a first distance along the first direction, and wherein the substrate comprises a plurality of substrates spaced apart from each other at a second distance along the second direction.

5. The display apparatus of claim 4, wherein the second distance is at least fifty percent greater than the first distance.

6. The display apparatus of claim 4, further comprising a reflective sheet disposed between the liquid crystal panel and the backlight unit, and provided to cover the plurality of substrates, wherein a plurality of holes are formed through the reflective sheet to allow the first lens and the second lens to pass therethrough.

7. The display apparatus of claim 4, further comprising a plurality of reflective sheets provided between the liquid crystal panel and the backlight unit, and respectively corresponding to the plurality of substrates, wherein the first lens and the second lens extend through a plurality of holes formed through the plurality of reflective sheets.

8. The display apparatus of claim 1, wherein the first refractive cover is formed by dispensing and curing a transparent material in a liquid state.

9. The display apparatus of claim 1, wherein the first light emitting diode is mounted on the substrate in a chip on board (COB) method.

10. The display apparatus of claim 1, wherein the first light emitting diode is configured to emit blue light.

11. A display apparatus, comprising:

a liquid crystal panel; and a backlight unit configured to emit light to the liquid crystal panel, wherein the backlight unit comprises:

a plurality of substrates each extending along a first direction;

a plurality of light emitting diodes provided on each of the plurality of substrates, the plurality of light emitting diodes on each of the plurality of substrates being arranged in the first direction;

a plurality of refractive covers provided on the plurality of light emitting diodes to refract light emitted from the plurality of light emitting diodes, each of the plurality of refractive covers comprising a curved outer surface; and a package lens comprising a plurality of lenses on the plurality of refractive covers, and a connector connecting the plurality of lenses to each other, wherein the package lens is provided on one of the plurality of substrates and receives the plurality of refractive covers therein, wherein the plurality of light emitting diodes are spaced apart from each other at a first distance along the first direction, wherein the plurality of substrates are spaced apart from each other at a second distance, which is longer than the first distance, along a second direction perpendicular to the first direction, wherein each of the plurality of lenses comprises a bottom surface having a first length in the first direction that is less than a second length in the second direction, and is configured to emit more light in the second direction than in the first direction, wherein the connector connects the bottom surfaces of the plurality of lenses, and wherein the connector is coupled to one of the plurality of substrates and extends along the first direction.

12. The display apparatus of claim 11, wherein a receiving groove formed in each of the plurality of lenses defines a plurality of receiving spaces, and wherein the plurality of refractive covers are respectively provided in the plurality of receiving spaces.

13. The display apparatus of claim 12, wherein each of the plurality of refractive covers is spaced apart from a corresponding lens within the plurality of receiving spaces.

14. The display apparatus of claim 12, wherein a length of the receiving groove in the first direction is greater than a length of the receiving groove in the second direction.

15. The display apparatus of claim 11, wherein the second distance is at least fifty percent greater than the first distance.

16. The display apparatus of claim 11, further comprising a reflective sheet disposed between the liquid crystal panel and the backlight unit, and provided to cover the plurality of substrates, wherein a plurality of holes are formed through the reflective sheet to allow the plurality of lenses to pass therethrough.

17. The display apparatus of claim 11, further comprising a plurality of reflective sheets provided between the liquid crystal panel and the backlight unit, and respectively corresponding to the plurality of substrates, wherein the plurality of lenses extend through a plurality of holes formed through the plurality of reflective sheets.

* * * * *